United States Patent [19]

Hall

[11] 4,060,432
[45] Nov. 29, 1977

[54] METHOD FOR MANUFACTURING NUCLEAR RADIATION DETECTOR WITH DEEP DIFFUSED JUNCTION

[75] Inventor: Robert N. Hall, Schenectady, N.Y.

[73] Assignee: General Electric Co., Schenectady, N.Y.

[21] Appl. No.: 623,974

[22] Filed: Oct. 20, 1975

[51] Int. Cl.$^2$ .......................................... H01L 21/228
[52] U.S. Cl. .................................... 148/186; 148/191
[58] Field of Search ............... 148/186, 187, 188, 190, 148/191, 33; 357/29; 252/62.3 E; 204/39

[56] References Cited

U.S. PATENT DOCUMENTS

| | | | |
|---|---|---|---|
| 2,725,316 | 11/1955 | Fuller | 148/186 |
| 2,819,990 | 1/1958 | Fuller et al. | 148/186 |
| 2,836,523 | 5/1958 | Fuller | 148/188 X |
| 3,340,598 | 9/1967 | Hatcher | 148/1.5 X |
| 3,374,124 | 3/1968 | Tavendale | 148/186 |
| 3,795,547 | 3/1974 | Hall | 148/1.5 X |
| 3,826,721 | 7/1974 | Hall | 204/39 |

OTHER PUBLICATIONS

Llacer, *Nuclear Instruments and Methods*, vol. 98, 1972, pp. 259–268.

*Primary Examiner*—G. Ozaki
*Attorney, Agent, or Firm*—Jack E. Haken; Joseph T. Cohen; Jerome C. Squillaro

[57] ABSTRACT

Germanium radiation detectors are manufactured by diffusing lithium into high purity p-type germanium. The diffusion is most readily accomplished from a lithium-lead-bismuth alloy at approximately 430° C. and is monitored by a quartz half cell containing a standard composition of this alloy.

Detectors having n-type cores may be constructed by converting high purity p-type germanium to n-type by a lithium diffusion and subsequently diffusing some of the lithium back out through the surface to create a deep p-n junction.

Coaxial germanium detectors comprising deep p-n junctions are produced by the lithium diffusion process.

15 Claims, 22 Drawing Figures

METHOD FOR MANUFACTURING NUCLEAR RADIATION DETECTOR WITH DEEP DIFFUSED JUNCTION

BACKGROUND OF THE INVENTION

This invention relates to solid state, nuclear radiation detectors. More specifically, this invention relates to germanium radiation detectors wherein deep p-n junctions are produced by the diffusion of lithium.

Germanium devices for the detection of gamma radiation are well known. Typically, gamma radiation is caused to impinge on a germanium body at 77° K. A p-n junction is formed within the germanium and is reverse biased with an electric field to deplete charge carriers from a volume adjoining the junction. Gamma rays impinging on the depleted region excite charge carriers and produce a current pulse across the junction.

It is desirable to produce germanium detectors having large electric fields within the depletion region. Such fields increase the drift velocity of charge carriers within the detector and thereby improve the detector pulse response time. High fields also minimize the effects of charge carrier trapping within the depletion region.

It is generally undesirable, however, to operate germanium detectors with high electric fields in the surface or contact regions. High surface fields contribute to detector noise and increase the probability of breakdown between contacts. Prior art germanium radiation detectors have generally been produced by a lithium drifting process which is described, for example, in U.S. Pat. No. 3,016,313 to Pell. A high concentration of lithium is diffused into the surface of a body of p-type germanium to form a narrow p-n junction. The germanium is heated while a strong, reversed bias electric field is applied across the junction to drift the lithium through the structure. The electric fields in coaxial lithium drifted germanium detectors reach their highest values at the radius of the inner electrode. Drifted detectors must, generally, be stored and operated at cryogenic temperatures to prevent precipitation of the highly concentrated lithium dopant.

Germanium detectors have also been formed by producing a p-n junction at one surface of a body of high purity p-type germanium, for example, those described in *Planar and Coaxial High Purity Germanium Radiation Detectors*, J. Llacer, Nuclear Instruments and Methods, 98 (1972), 259–268. Detectors of this type are characterized by high electric field concentrations in the region of the negative contact.

Prior art methods, for example diffusion or ion implantation, are incapable of producing a junction deep within a germanium body.

Prior art planar detectors have also been produced by utilizing naturally occurring junctions within bodies of high purity germanium, for example, those described in *A Large Volume High Purity Germanium Radiation Detector*, J. Llacer, Nuclear Instruments and Methods, 104 (1972), 249–251. The geometry of such detectors is, however, limited by the occurrence and shape of the natureal p-n junctions which occur in a random and unpredictable manner during germanium crystal growth.

SUMMARY OF THE INVENTION

I have determined that germanium radiation detectors may be produced by diffusing lihium into germanium crystals to produce p-n junctions deep within a germanium body. The electric field concentration in such detectors is highest in the vicinity of the junction and falls to a minimum at the detector surfaces. Detectors of this type may, therefore, be operated at high electric field intensities without exhibiting surface breakdown phenomena typical of prior art detectors. The lithium concentrations produced by the diffusion process are very small, being of the same order of magnitude as the acceptor atom concentrations in high purity germanium crystals. Detectors produced in accordance with this invention may, therefore, be stored at room temperature without suffering the effects of lithium precipitation which characterize prior art lithium drifted detectors.

The geometry of germanium radiation detectors which are produced in accordance with my lithium diffusion process may be controlled and varied. For example, deep junction detectors produced in accordance with this process may be constructed in coaxial form with either p-type or n-type germanium outermost.

It is, therefore, an object of this invention to produce germanium radiation detectors which are capable of operating with high electric field intensities.

Another object of this invention is to produce germanium radiation detectors having low electric field intensities at the crystal surface and high electric field intensities at the crystal interior.

Another object of this invention is to produce germanium radiation detectors which may be stored at room temperature.

Another object of this invention is to produce deep junction germanium radiation detectors having a coaxial or other desirable geometry.

BRIEF DESCRIPTION OF THE DRAWINGS

The novel features believed to be characteristic of the invention are set forth in the appended claims. The invention itself, together with further objects and advantages thereof, may be best understood by reference to the following description taken in connection with the appended drawings in which:

DESCRIPTION OF THE PREFERRED EMBODIMENTS

A nuclear radiation detector may be formed by applying a reverse electric field to deplete charge carriers from the volume adjoining a junction in a germanium crystal. Nuclear particles interact with the germanium crystal to produce electron-hole pairs which are swept from the depleted region by the electric field. The electron-hole flow within the detector crystal produces an electric current pulse in an external circuit which may be measured or counted to determine the nature and quantity of the nuclear radiation. The maximum counting rate possible with such a detector is in part determined by the speed with which electrons and holes are swept from the depletion region. It is, therefore, desirable to operate such a detector with the highest possible electric field strength. A high electric field strength also tends to minimize the possibility of electrons and holes being trapped at sites within the depletion region.

Prior art germanium detectors have commonly been formed by drifting lithium through p-type germanium under the influence of an electric field. The lithium atoms neutralize acceptor atoms within the germanium to create a wide p-n junction. Typically, the lithium concentration in drifted detectors is high enough (for example, $3 \times 10^{14}$ atoms/cc) to precipitate lithium within the crystal at room temperature. Drifted detectors must, therefore, at all times be stored at cryogenic temperatures to prevent such precipitation which would render the detector inoperable.

Figure 2:
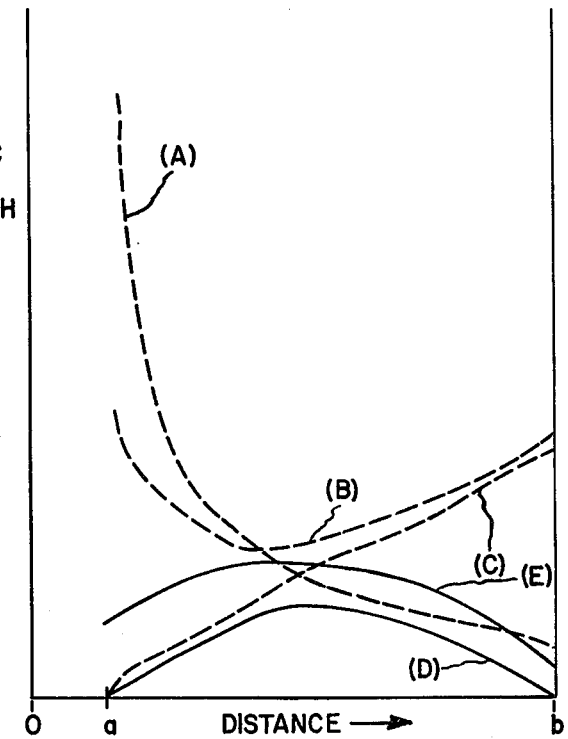
FIG. 2 graphically illustrates the electric field distribution within several types of germanium radiation detectors.

Curve A of FIG. 2 illustrates the electric field distribution within a coaxial lithium drifted detector having an inner radius $a$ and an outer radius $b$; the electric field strength rises sharply to a maximum at the inner surface. The maximum voltage which may be applied to such a detector is, therefore, limited by the breakdown characteristics at the inner surface which will arc or produce noise if the voltage is increased above a critical value.

Prior art coaxial germanium detectors have also been produced from high purity germanium in accordance with the above-described method of Llacer. The surface junctions of such detectors tend to produce electric field distributions illustrated by curves B and C of FIG. 2. The electric field strength in such detectors may be seen to rise to a maximum value at the contact surfaces and tends to limit the maximum applied voltage in a manner similar to that encountered in lithium drifted detectors.

Planar detectors of the prior art have also been constructed from natural p-n junctions which occasionally occur within germanium crystals. At full depletion, the electric field strength distribution within a detector of this type is similar in shape to curve D of FIG. 2; the electric field is zero at the contact surfaces and rises to a maximum at the center of the crystal. For higher applied voltages, the electric field strength at the contacts rises (similar to curve E of FIG. 2) but still remains less than the field strength in the crystal interior. Detectors containing deep internal junctions are, therefore, relatively insensitive to the voltage limiting effects which are caused by the high electric field at the contacts of the other type detectors.

Naturally occurring p-n junctions in high purity germanium are a relatively uncontrolled phenomenon and it would be impractical to produce commercial radiation detectors of this type. The geometry of detectors containing such junctions is of course limited by the shape of the grown-in junction and could not be optimized for commercial detector applications, for example, coaxial geometries.

I have determined that junctions may be produced deep within high purity germanium crystals by a controlled diffusion of lithium into p-type germanium. The junctions produced by this method may assume a variety of geometries but, for the production of germanium detectors, are most advantageously formed in a coaxial cylindrical geometry. In the following examples of preferred embodiments of my invention the diffusion process will be described with respect to such coaxial geometries. It is to be understood, however, that my process is not so limited and may be conducted, for example, in planar or other geometries to produce detectors which are optimally shaped for special applications.

Figure 1:
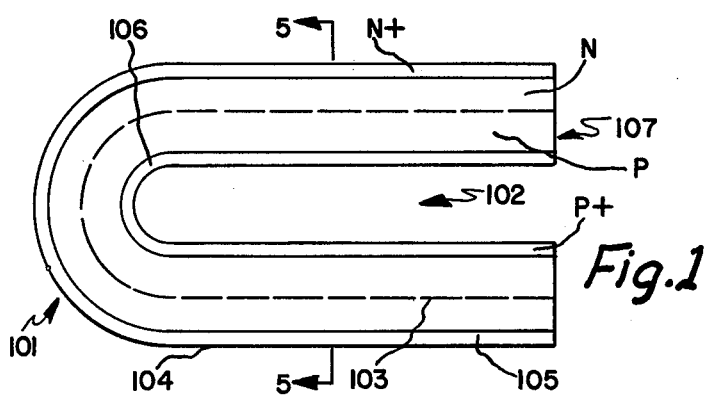
FIG. 1 is a schematic, sectional view of a coaxial radiation detector of the present invention.

FIG. 1 illustrates a typical detector produced in accordance with the present invention. The detector comprises a cylinder of germanium having a hemispherical end 101 and which is cored to produce a reentrant cavity 102. A deep p-n junction 103 is produced, in a manner more fully described below, between the outer wall of the cylinder 104 and the wall of the cavity 102. The radius of the junction 103 is typically approximately 70 percent of the outer radius of the outer wall 104. In the geometry illustrated, the outer portion of the cylinder forms the n-type contact while the inner portion of the cylinder forms a p-type contact. This geometry may, however, be reversed in a manner more fully described in later paragraphs. An $n+$ contact 105 covers the outer surface of the cylinder while a $p+$ contact 106 is applied to and covers the wall of the cavity 102. A reversed bias electric field is applied between the $n+$ contact 105 and the $p+$ contact 106 to deplete the junction 103 and operate the detector in a conventional manner. The detector is normally operated at cryogenic temperatures in a manner typical of other forms of germanium radiation detectors.

Figure 3:
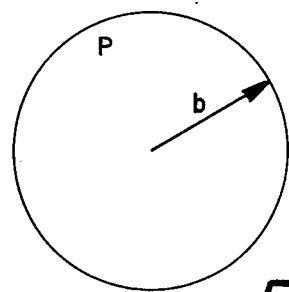
FIGS. 3, 4, and 5 illustrate sequential steps utilized in manufacturing the radiation detector of FIG. 1.
Figure 3A:
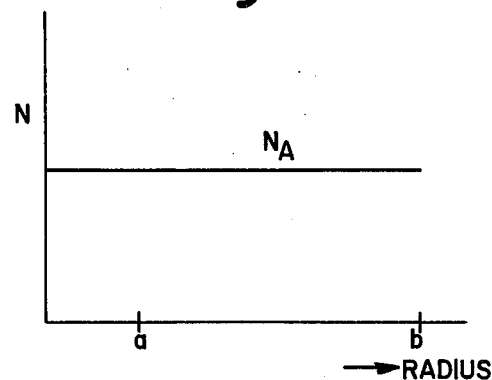
FIGS. 3a, 4a, and 5a graphically illustrate the impurity concentration within a germanium crystal during the manufacturing steps of FIGS. 3, 4, and 5.

The detectors of the present invention may be manufactured by forming a cylinder of high purity p-type germanium having an outer radius $b$ as illustrated in the schematic sectional diagram, FIG. 3. The cylinder may be most advantageously formed with hemispherical ends and may be sectioned after diffusion to produce two detectors of the geometry illustrated in FIG. 1. The p-type germanium should be of a high purity type typically with an acceptor concentration between approximately $1 \times 10^{10}$ and approximately $5 \times 10^{10} \text{cm}^{-3}$. High purity germanium of this type may be produced in accordance with the methods of my U.S. Pat. Nos. 3,671,330 and 3,795,547. The distribution of acceptor impurities within the p-type crystal of FIG. 3 is substantially constant and is illustrated graphically in FIG. 3a.

Lithium is then diffused into the outer surface of the crystal to neutralize the acceptor carriers and produce an n-type outer region. The diffusion is most readily accomplished by immersing the germanium crystal in a molten mixture of Bi-Pb eutectic alloy containing predetermined additions of Li, for a time sufficient to produce a p-n junction at a desired depth within the crystal. Specific examples of a similar technique have been described by Kegel in *Nuclear Instruments and Methods*, 105 (1972) 381-382, which article is incorporated by reference in this specification. It should be noted, however, that Kegel describes diffusion techniques for producing shallow lithium contacts and thus utilizes much greater lithium concentrations and shorter diffusion times than those which are useful in my process. The lithium concentration in the Bi—Pb alloy is a critical factor in the practice of my diffusion process. Special techniques (described below) must be practiced to minimize lithium loss by oxidation during the preparation of the alloy and operation of the diffusion step. The concentration of lithium used in the diffusion process may be most accurately and advantageously determined by use of a lithium half cell in a manner more particularly described in the following paragraphs.

Figure 4:
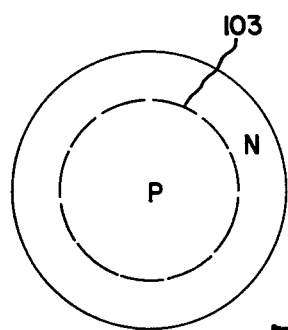
Figure 4A:
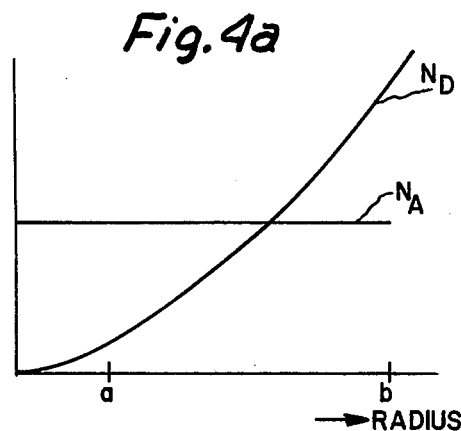

The concentration of acceptor and donor impurities within the crystal of FIG. 4 is graphically illustrated in FIG. 4a. The diffused lithium may be seen to produce a wide junction 103 of p and n type material deep within the crystal. The diffusion process parameters are calculated, using well known formulas; typically the lithium concentration at the surface of the crystal following the diffusion step should be between approximately 1.5 times and approximately four times the initial acceptor atom concentration.

Figure 5:
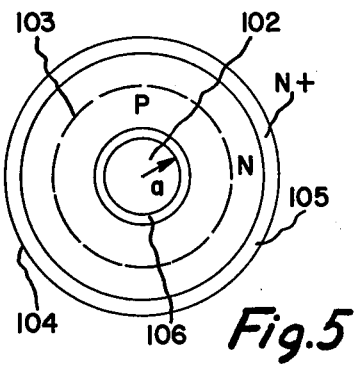

The crystal is then cut to form two detector sections and cored to produce the coaxial structure of FIG. 1 and FIG. 5. A shallow diffusion of concentrated lithium is performed on the outer surface of the cylinder to produce an $n+$ contact 105 in a conventional manner. An Au or Pd $p+$ contact 106 is similarly applied to the inner cored surface in a conventional manner. The $p+$ may also be produced by liquid epitaxial regrowth by filling the cavity with a liquid acceptor alloy, heating and recooling the crystal, and decanting the liquid metal before it solidifies. The distribution of donor and acceptor impurities within the detector of FIG. 5 is illustrated schematically in FIG. 5a.

The coaxial detector geometry of FIG. 1 is particularly advantageous for germanium detectors constructed by these methods. Only a single surface 107 of the p-n junction is exposed during the later steps of the manufacturing process. The probability of damage to the junction during final processing, finishing, and mounting steps is thereby reduced.

Figure 5A:
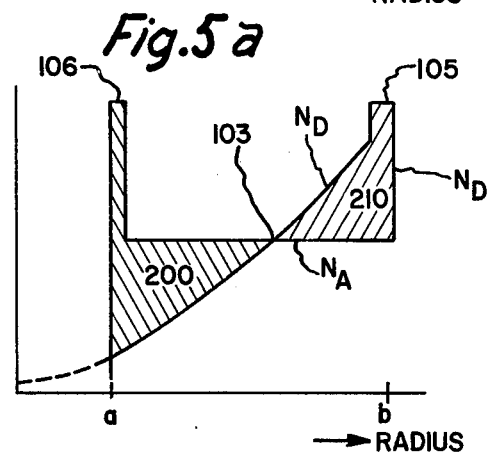

The optimal position of the p-n junction within the crystal may be determined by reference to the illustration of FIG. 5a. The junction should be positioned so that the net excess of acceptor atoms in the p region 200 is equal to the net excess of donor atoms in the n region 210.

Figure 6:
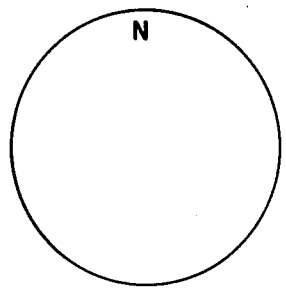
FIGS. 6, 7, and 8 illustrate sequential steps for manufacturing a coaxial radiation detector having an internal n contact.
Figure 6A:
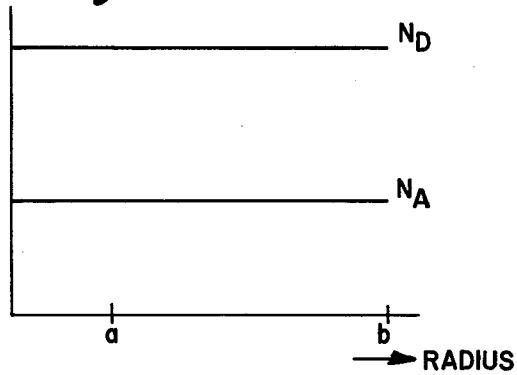
FIGS. 6a, 7a, and 8a illustrate the impurity concentrations in a germanium crystal during the manufacturing steps of FIGS. 6, 7, and 8.
Figure 7:
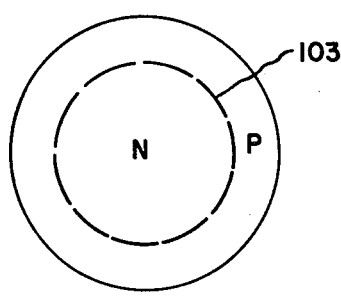
Figure 7A:
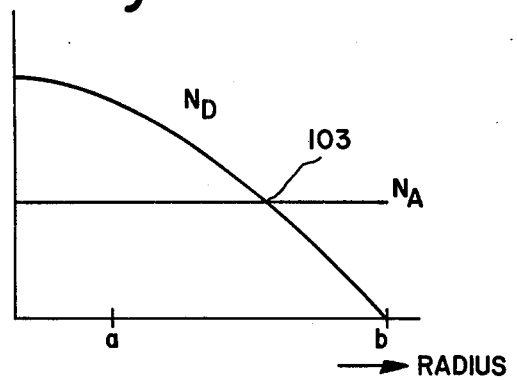
Figure 8:
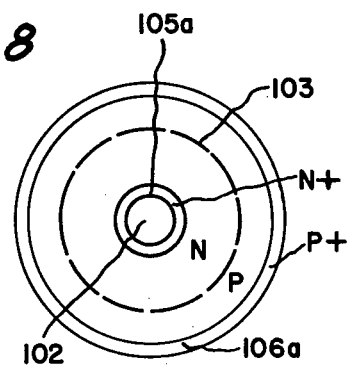
Figure 8A:
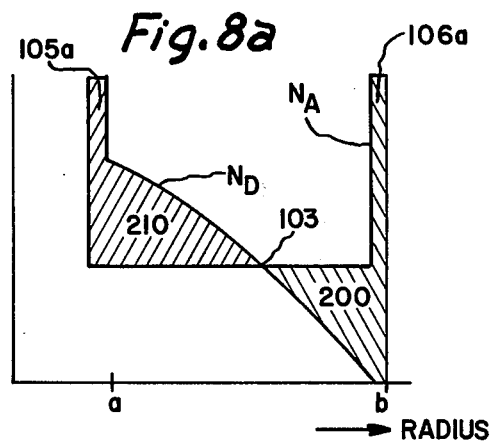

It is often more advantageous to produce a coaxial detector having an external p-type region. For example, the $p+$ contact may be more readily formed by any of several methods including vacuum evaporation of Au or Pd, ion implantation of B, $BF_3$ glow discharge, or solid phase epitaxy onto the outer surface of the germanium cylinder. Such a detector may be prepared by adding a small quantity of lithium during the preparation of high purity p-type germanium. The resulting crystal will be n-type as illustrated in FIG. 6 and will be characterized by a uniform acceptor impurity concentration and a somewhat greater, uniform donor concentration illustrated in FIG. 6a. Lithium from the surface of the crystal is then diffused out into a lead bismuth alloy bath at approximately 400° C for a predetermined time in a manner which is described in my U.S. Pat. No. 3,795,547. The resulting structure and impurity concentrations are illustrated in FIG. 7 and FIG. 7a. The crystal is then cored and $p+$ 106a and $n+$ 105a contacts are applied in a conventional manner (FIG. 8). The resulting impurity concentrations are indicated in FIG. 8a. As in the previous example, junction 103 position should be determined so that the net acceptors 200 in the p region equals the net donors 210 in the n region.

Figure 10:
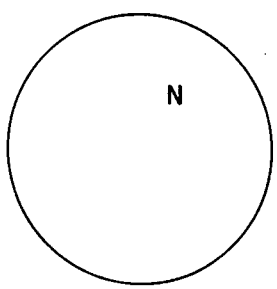
FIGS. 9, 10, 11 and 12 illustrate the steps for an alternate, preferred method for manufacturing a coaxial radiation detector having an *n*-contact innermost.
Figure 10A:
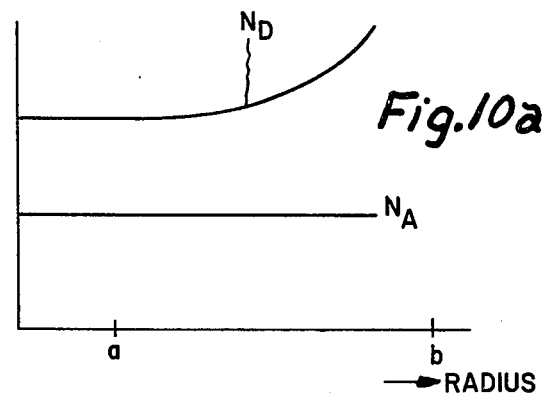
FIGS. 9a, 10a, and 11a illustrate the impurity concentrations in a germanium crystal during the manufacturing steps of FIGS. 9, 10, and 11.
Figure 11:
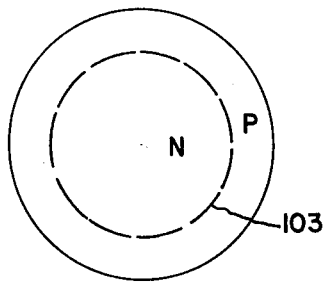
Figure 11A:
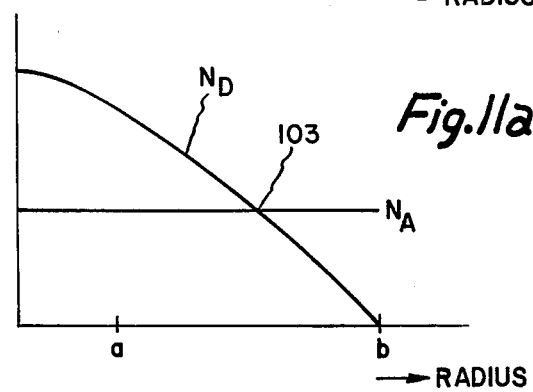
Figure 12:
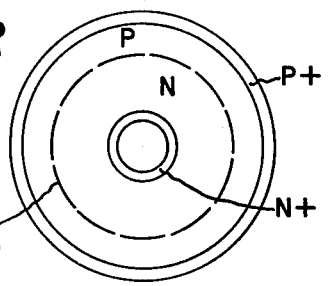
Figure 9:
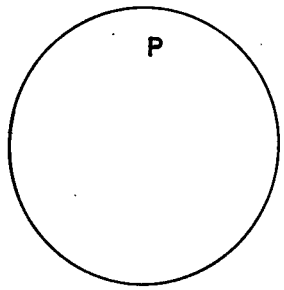
Figure 9A:
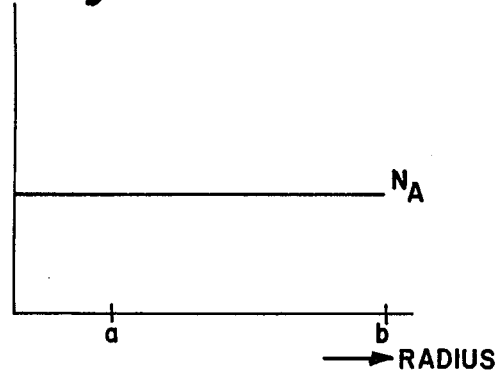

It is often difficult to obtain long rods of germanium having uniform, controlled concentrations of acceptors and lithium which are required for use in the last described process. An alternate and preferred mode for producing n-core coaxial detectors which avoids this difficulty is illustrated in FIGS. 9-12. A cylinder of high purity p-type germanium having a uniform acceptor concentration is formed in the manner discussed above with reference to p core coaxial detectors (FIGS. 9 and 9a). Lithium is then diffused into the crystal for a sufficient time to convert the conductivity of the entire crystal to n type (FIG. 10). The concentration of donor atoms in the crystal will vary as a function of the crystal radius as illustrated in FIG. 10a and its value can be easily determined by electrical measurement. The lithium is then out-diffused into a Bi—Pb alloy to create a deep p-n junction 103 in the manner indicated above (FIGS. 11 and 11a). The required out-diffusion time is readily calculated from the lithium concentration measured after the first diffusion step, to produce a junction at the desired depth. The crystal is then divided, cored, and processed to produce conventional $p+$ and $n+$ contacts (FIG. 12).

The lithium diffusion of the present method may most readily be accomplished utilizing lithium dissolved in a lead bismuth alloy. The alloy is advantageously maintained at temperatures between approximately 400° C and approximately 600° C. Low alloy temperatures tend to increase the diffusion time beyond practical commercial limits while high alloy temperatures contribute to lattice defects and to the formation of solutions of germanium in the diffusion alloy. Lithium loss during preparation of the alloy must be minimized, for example, by first forming a eutectic mixture of approximately 20 atomic percent of Li and 80 percent Pb. A measured quantity of the Li—Pb mixture is then added to a molten Bi—Pb alloy to produce a Bi—Pb alloy with a known lithium concentration. the Li—Pb eutectic may be stored under xylene to prevent oxidation of the lithium.

Figure 13:
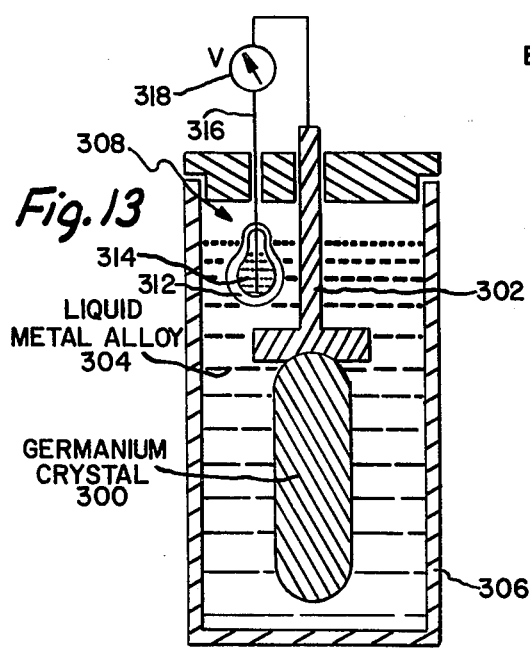
FIG. 13 illustrates apparatus for diffusing controlled quantities of lithium into a germanium crystal.

The diffusion process is most advantageously performed in the apparatus illustrated in FIG. 13. The germanium crystal 300 is supported from a metal rod 302 under the liquid metal diffusion alloy (described above) 304 within a quartz crucible 306. The lithium concentration in the Bi—Pb alloy 304 may be conveniently monitored with a half cell 308. The half cell comprises a fused quartz bulb 312 disposed in the Bi—Pb diffusion alloy 304 and contains a liquid mixture of Bi—Pb eutectic alloy with approximately 0.1 wt percent Li—Pb eutectic alloy 314. A tungsten wire 316 contacts the alloy solution 314. Lithium concentration in the Bi—Pb alloy 304 may be effectively monitored with a voltmeter 318 connected between the crystal support rod 302 and the tungsten wire 316, using the well-known formula for an electrochemical concentration cell.

EXAMPLE

An n-core coaxial germanium radiation detector having an outside radius of 2.46 cm was constructed in the following manner;

An Li—Pb eutectic alloy containing approximately 20 atomic percent lithium was added to a liquid Bi—Pb eutectic alloy at 430° C to produce a ratio Li—Pb/Bi- —Pb of $1.126 \times 10^{-4}$. A germanium rod 12 cm long, having an outside diameter of 4.92 cm and an initial acceptor concentration of $4 \times 10^{10}$ acceptors cm$^{-3}$ was suspended in the liquid alloy within the apparatus of FIG. 13 for approximately 35 days. The initial voltage drop across the half cell of FIG. 13 was 113.6 mv. After the diffusion process, the half cell voltage rose to approximately 119 mv. The average donor concentration within the crystal was then determined by electrical measurement to be $12 \times 10^{10}$ cm$^{-3}$.

The crystal was then immersed in a pure Bi—Pb eutectic alloy at 430° C for approximately 13.8 days to out-diffuse lithium from the surface of the crystal. The crystal was cut to produce two rods and cored to form a hollow coaxial structure. Electrical probe measurements showed this junction to be at a radius of 1.6 cm. After etching in a conventional white etch, an internal $n+$ contact was formed by filling the core cavity with a solution of LiAlH$_4$ and processing for one hour at 250° C in a nitrogen atmosphere. An external $p+$ contact was formed by vacuum evaporating gold onto the outer surface in a conventional manner.

The methods of the present invention allow production of germanium radiation detectors which are capable of operating with higher electric fields than prior art, commercially produced detectors. The junctions in these detectors may be positioned at will, deep within the crystal and may be constructed in coaxial, planar, or other geometries. The detectors may be stored and shipped at room temperature and will, therefore, find far wider application than prior art lithium drifted detectors.

While the invention has been described in detail herein in accordance with preferred embodiments thereof, many modifications and changes therein may be effected by those skilled in the art. Accordingly, it is intended by the appended claims to cover all such modifications and changes as fall within the true spirit and scope of this invention.

The invention claimed is:

1. A method for manufacturing deep junctions in germanium bodies comprising:
    forming a body of high purity p-type germanium having an initial acceptor concentration and
    diffusing lithium, from a precalculated concentration of lithium, deep into said body, in the absence of electrolytic processes within said body, to form a junction of high purity n-type germanium and high purity p-type germanium within said body.

2. The method of claim 1 wherein said precalculated lithium concentration at the surface of said body is between approximately 1.5 and approximately 4 times the initial acceptor atom concentration in said body.

3. The method of claim 2 wherein said junction is formed at a depth whereat the number of excess acceptor impurities in said p-type germanium is substantially equal to the number of excess donor impurities in said n-type germanium.

4. The method of claim 1 wherein said high purity p-type germanium is between approximately $1 \times 10^{10}$ and approximately $5 \times 10^{10}$ acceptors-cm$^{-3}$.

5. The method of claim 1 further including the step of fabricating said body to expose said p-type germanium and said n-type germanium.

6. The method of claim 5 wherein the body is a cylinder and the fabricating step comprises coring said cylinder whereby a coaxial structure is formed.

7. The method of claim 5 further including the step of forming electrical contacts on said p-type germanium and on said n-type germanium.

8. The method of claim 7 wherein said forming step comprises forming $n+$ contacts by lithium diffusion on said n-type germanium and forming $p+$ contacts by metal evaporation on said p-type germanium.

9. The method of claim 1 wherein said junction is formed at a depth greater than 1 mm from the surface of said body.

10. A method for manufacturing deep junctions in a germanium body comprising:
    forming a body of high purity p-type germanium having an initial acceptor concentration and
    first diffusing lithium, from a precalculated concentration of lithium, deep into said body and
    subsequently diffusing lithium outward from the surface of said body, to form a junction of high purity p-type germanium and high purity n-type germanium deep within said body.

11. The method of claim 10 wherein the first diffusing step comprises immersing said body in a first molten alloy of lead and bismuth containing a predetermined low concentration of lithium, and the subsequent diffusion step comprises immersing said body in a second molten alloy of lead and bismuth which is substantially free of lithium.

12. The method of claim 11 wherein the diffusing step is performed at a temperature between approximately 400° C and approximately 600° C.

13. The method of claim 12 wherein said diffusing step further comprises monitoring the lithium concentration in said alloy by means of a voltage producing half cell.

14. The method of claim 13 wherein said half cell comprises a mixture of lithium, lead, and bismuth contained in a quartz bulb.

15. The method of claim 11 wherein said first alloy is formed by mixing a lithium-lead eutectic alloy with a lead-bismuth eutectic alloy.

* * * * *